(12) United States Patent
Widjaja et al.

(10) Patent No.: US 7,058,106 B2
(45) Date of Patent: Jun. 6, 2006

(54) SCREENABLE MOISTURE-PASSIVATED PLANAR INDEX-GUIDED VCSEL

(76) Inventors: Wilson H. Widjaja, 10400 Lindsay Ave., Cupertino, CA (US) 95014; Bernhard Ulrich Koelle, 350 Elan Village La. #224, San Jose, CA (US) 95134

(*) Notice: Subject to any disclaimer, the term of this patent is extended or adjusted under 35 U.S.C. 154(b) by 327 days.

(21) Appl. No.: 10/731,960

(22) Filed: Dec. 10, 2003

(65) Prior Publication Data

US 2005/0129076 A1  Jun. 16, 2005

(51) Int. Cl.
    *H01S 5/00*  (2006.01)
(52) U.S. Cl. ............... 372/50.124; 372/50.1; 372/43.01; 372/46.01; 372/45.01
(58) Field of Classification Search .............. 372/50.1, 372/43.01, 50.124, 46.01, 45.01
    See application file for complete search history.

(56) References Cited

U.S. PATENT DOCUMENTS

| | | | |
|---|---|---|---|
| 5,708,280 A * | 1/1998 | Lebby et al. ................. 257/88 |
| 5,719,893 A | 2/1998 | Jiang et al. | |
| 5,821,571 A * | 10/1998 | Lebby et al. ................. 257/98 |
| 5,896,408 A | 4/1999 | Corzine et al. | |
| 5,978,408 A | 11/1999 | Thornton | |
| 6,356,686 B1 | 3/2002 | Kuczynski | |
| 6,515,305 B1 * | 2/2003 | Gopinath ................... 257/79 |
| 6,680,964 B1 * | 1/2004 | Kim et al. ................... 372/96 |
| 6,982,182 B1 * | 1/2004 | Kim et al. ................... 372/45 |
| 6,765,943 B1 * | 7/2004 | Jewell ................... 372/46.013 |
| 6,819,697 B1 * | 11/2004 | Widjaja et al. .......... 372/46.013 |

OTHER PUBLICATIONS

Danielle Chamberlin, et al. "Failure Mode analysis of Oxide VCSELs in high huminity and high temperature" Journal Of Lightwave Technology, vol. 21, No. 4, Apr. 2003, pp. 1013-1019.*

* cited by examiner

*Primary Examiner*—Minsun Harvey
*Assistant Examiner*—Delma R. Flores-Ruiz

(57) ABSTRACT

Screenable vertical cavity surface emitting lasers (VCSELs) and methods of manufacturing the same are described. These systems and methods address the unique susceptibility of these devices to damage that otherwise might be caused by moisture intrusion into the etch holes that are used to form the index-guiding confinement regions. In one aspect, a VCSEL includes a vertical stack structure having a top surface. The vertical stack structure includes a top mirror, a bottom mirror, and a cavity region that is disposed between the top mirror and the bottom mirror and includes an active light generation region. At least one of the top mirror and the bottom mirror has at least one layer defining an aperture region. The vertical stack structure defines at least one sidewall area extending from the top surface to at least a depth corresponding to the aperture region. The is VCSEL further includes a defect indicator system that is disposed in a screening region at the sidewall area. The defect indicator system includes an indicator layer with a chemically alterable optical property, and a barrier layer overlying the indicator layer.

20 Claims, 4 Drawing Sheets

SCREENABLE MOISTURE-PASSIVATED PLANAR INDEX-GUIDED VCSEL

BACKGROUND

A VCSEL is a laser device formed from an optically active semiconductor layer (e.g., AlInGaAs or InGaAsP) that is sandwiched between a pair of highly reflective mirror stacks, which may be formed from layers of metallic material, dielectric material or epitaxially-grown semiconductor material. Typically, one of the mirror stacks is made less reflective than the other so that a portion of the coherent light that builds in a resonating cavity formed in the optically active semiconductor layer between the mirror stacks may be emitted from the device. Typically, a VCSEL emits laser light from the top or bottom surface of the resonating cavity with a relatively small beam divergence. VCSELs may be arranged in singlets, one-dimensional or two-dimensional arrays, tested on wafer, and incorporated easily into an optical transceiver module that may be coupled to a fiber optic cable.

In general, a VCSEL may be characterized as a gain-guided VCSEL or an index-guided VCSEL. An implant VCSEL is the most common commercially available gain-guided VCSEL. An implant VCSEL includes one or more high resistance implant regions for current confinement and parasitic reduction. An oxide VCSEL, on the other hand, is the most common laterally index-guided VCSEL. An oxide VCSEL includes oxide layers (and possibly implant regions) for both current and optical confinement. VCSELs and VCSEL arrays have been successfully developed for single-mode operation and multi-mode operation at a variety of different wavelengths (e.g., 650 nm, 850 nm, 980 nm, 1300 nm and 1550 nm).

Techniques have been proposed for improving the performance and reliability of VCSELs. For example, U.S. Pat. No. 5,719,893 describes a scheme for passivating ridge and implant VCSELs against physical and chemical damage. In accordance with this scheme, a layer of insulating material covers the entire VCSEL structure, including the light-emitting aperture region and the surrounding top metal electrode. The insulating material has an optical thickness that is an integral multiple of one half of the wavelength of light that the VCSELs are designed to emit. The passivating layer covers the entire VCSEL device structure in order to protect the device from physical and chemical damage.

SUMMARY

In one aspect, the invention features a VCSEL that includes a vertical stack structure having a top surface. The vertical stack structure includes a top mirror, a bottom mirror, and a cavity region that is disposed between the top mirror and the bottom mirror and includes an active light generation region. At least one of the top mirror and the bottom mirror has at least one layer defining an aperture region. The vertical stack structure defines at least one sidewall area extending from the top surface to at least a depth corresponding to the aperture region. The VCSEL further includes a defect indicator system that is disposed in a screening region at the sidewall area. The defect indicator system includes an indicator layer with a chemically alterable optical property, and a barrier layer overlying the indicator layer.

In another aspect, the invention features a method of manufacturing the above-described VCSEL.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The embodiments described in detail below feature systems and methods of passivating planar index-guided VCSELs that address the unique susceptibility of these devices to damage that otherwise might be caused by moisture intrusion into the etch holes that are used to form the index-guiding confinement regions. In addition, these embodiments feature VCSELs with defect indicator systems that provide indications of defective moisture passivation of the VCSEL etch holes, allowing potentially defective VCSELs to be accurately and efficiently identified and screened from batches of VCSELs.

Figure 1A:
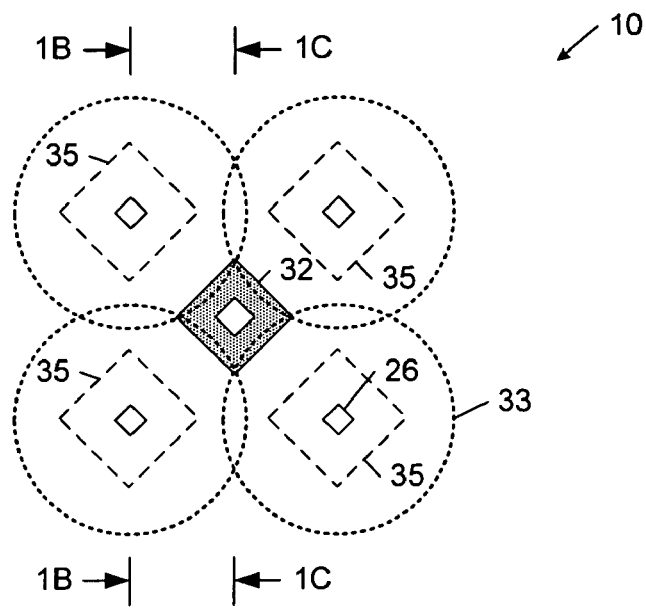
FIG. 1A is a diagrammatic top view of a planar VCSEL with four etched holes that are moisture passivated by an overlying moisture penetration barrier.
Figure 1B:
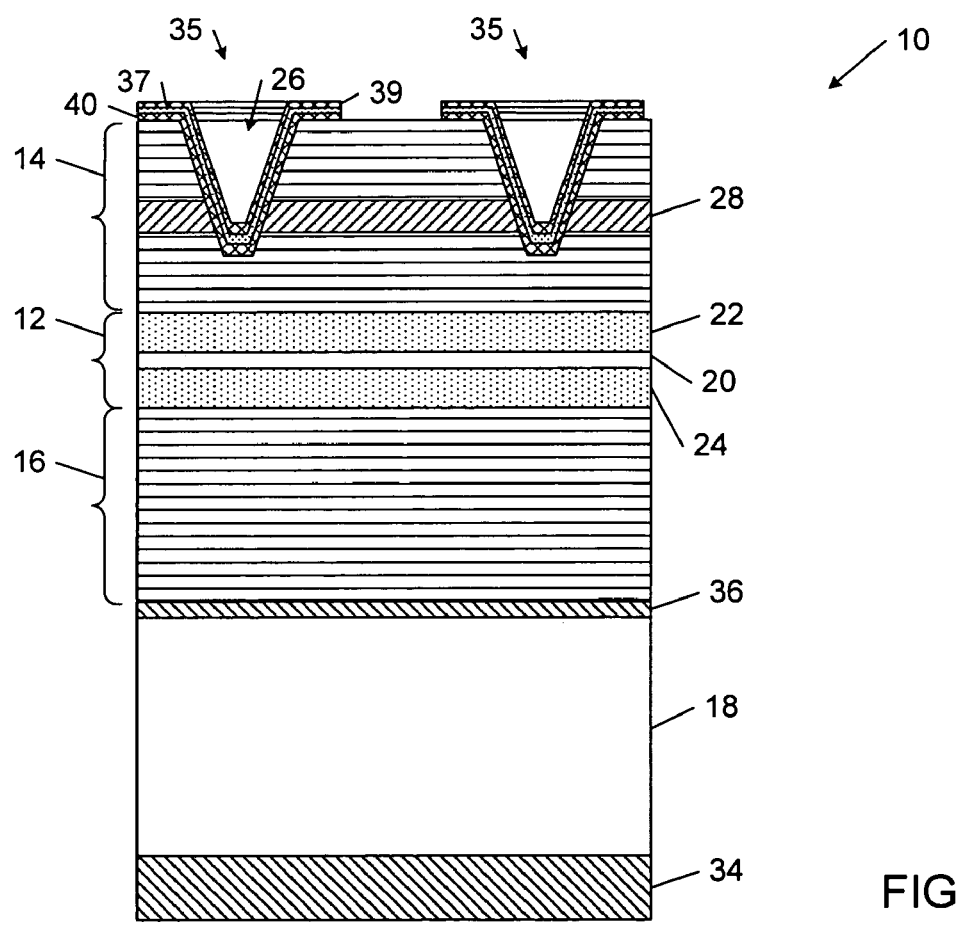
FIG. 1B is a diagrammatic cross-sectional side view of the planar VCSEL of FIG. 1A taken along the line 1B—1B.
Figure 1C:
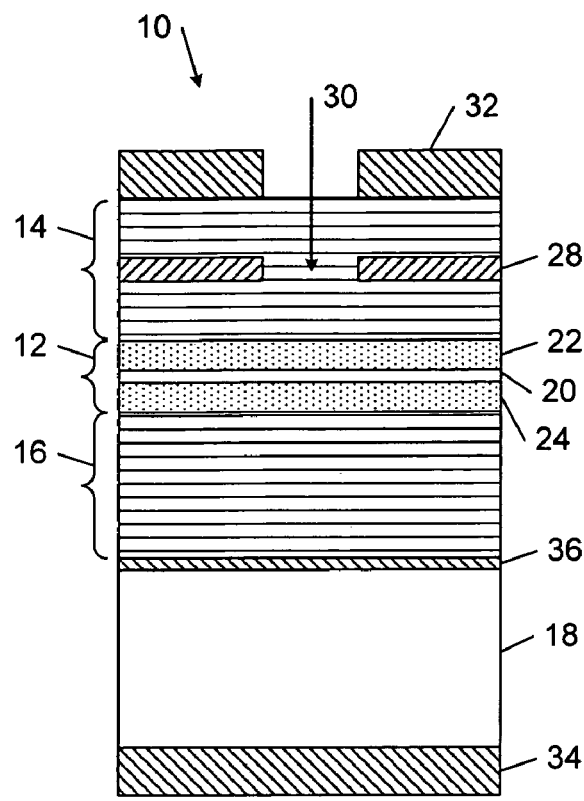
FIG. 1C is a diagrammatic cross-sectional side view of the planar VCSEL of FIG. 1A taken along the line 1C—1C.

Referring to FIGS. 1A, 1B and 1C, in one embodiment, a planar index-guided VCSEL 10 includes a cavity region 12 sandwiched between a first mirror stack 14 and a second mirror stack 16, which is formed on a substrate 18. Cavity region 12 includes one or more active layers 20 (e.g., a quantum well or one or more quantum dots) that are sandwiched between a pair of spacer layers 22, 24. In other embodiments, active layer 20 may be located above or below a single spacer layer. As shown, in this embodiment, VCSEL 10 has a planar structure that includes a number of holes 26 that expose a number of respective sidewall areas of first mirror stack 14 to be oxidized. At least a portion 28 of first mirror stack 14 is oxidized from the exposed sidewall areas inwardly toward a centrally located aperture region 30 (see FIG. 1C). As used herein, the term "aperture region" refers to a region in the vertical stack structure of VCSEL 10 that has a higher electrical conductivity than a surrounding peripheral region such that electrical current preferentially flows through the aperture region relative to the surrounding peripheral region. In the illustrated embodiment, four holes 26 are opened at locations that are equidistant from the center of a first electrical contact 32, as shown in FIG. 1A. Other VCSEL embodiments may include more or fewer exposure holes 26, or holes with different shapes, such as divided arcs or rings. Holes 26 extend from the substantially planar top surface of first mirror stack 14 down at least to the layer (or layers) corresponding to oxidized portion 28. In the illustrated embodiment, each etch hole 26 has a depth of about 8 μm and a width of about 26 μm at the top surface of first mirror stack 14. When the VCSEL structure is exposed to heated water vapor, the heated water vapor enters holes 26 and oxidizes portion 28 in a radial direction away from holes 26. The oxidation process continues until the oxidation front 33 from each hole 26 merges to form the un-oxidized aperture region 30, at which point the oxidation process is discontinued.

In other VCSEL embodiments, the aperture region 30 is defined by selective etching of the peripheral region of the vertical stack structure, rather than by selective oxidation of the peripheral region. In addition, in other embodiments, VCSEL 10 may be formed into a pillar-like structure with cylindrical sidewalls by etching regions of the vertical stack structure surrounding the pillar-like structure from the top surface to at least a depth corresponding to the aperture region 30.

Electrical contact 32 and a second electrical contact 34, which is located at the opposite end of the device, enable VCSEL 10 to be driven by a suitable driving circuit. In operation, an operating voltage is applied across electrical contacts 32, 34 to produce a current flow in VCSEL 10. In general, current flows through a central region of the VCSEL structure and lasing occurs in a central portion of cavity region 12 (hereinafter the "active region"). The oxidized portion 28 of first mirror stack 14 forms an oxide confinement region that laterally confines carriers and photons. Carrier confinement results from the relatively high electrical resistivity of the confinement region, which causes electrical current preferentially to flow through a centrally located region of VCSEL 10. Optical confinement results from a substantial reduction of the refractive index of the confinement region that creates a lateral refractive index profile that guides the photons that are generated in cavity region 12. The carrier and optical lateral confinement increases the density of carriers and photons within the active region and, consequently, increases the efficiency with which light is generated within the active region.

Active layer 20 may be formed from AlInGaAs (i.e., AlInGaAs, GaAs, AlGaAs and InGaAs), InGaAsP (i.e., InGaAsP, GaAs, InGaAs, GaAsP, and GaP), GaAsSb (i.e., GaAsSb, GaAs, and GaSb), InGaAsN (i.e., InGaAsN, GaAs, InGaAs, GaAsN, and GaN), or AlInGaAsP (i.e., AlInGaAsP, AlInGaAs, AlGaAs, InGaAs, InGaAsP, GaAs, InGaAs, GaAsP, and GaP). Other quantum well layer compositions also may be used. First and second spacer layers 22, 24 may be formed from materials chosen based upon the material composition of the active layers. First and second mirror stacks 14, 16 each includes a system of alternating layers of different refractive index materials that forms a distributed Bragg reflector (DBR) designed for a desired operating laser wavelength (e.g., a wavelength in the range of 650 nm to 1650 nm). For example, first and second mirror stacks 14, 16 may be formed of alternating layers of high aluminum content AlGaAs and low aluminum content AlGaAs. The layers of first and second mirror stacks 14, 16 preferably have an effective optical thickness (i.e., the layer thickness multiplied by the refractive index of the layer) that is about one-quarter of the operating laser wavelength. Substrate 18 may be formed from GaAs, InP, sapphire ($Al_2O_3$), or InGaAs and may be undoped, doped n-type (e.g., with Si) or doped p-type (e.g., with Zn). A buffer layer 36 may be grown on substrate 18 before VCSEL 10 is formed. In the illustrative representation of FIGS. 1A, 1B, and 1C, first and second mirror stacks 14, 16 are designed so that laser light is emitted from the top surface of VCSEL 10. In other embodiments, the mirror stacks 14, 16 may be designed so that laser light is emitted from the bottom surface of substrate 18.

VCSEL 10 may be formed by conventional epitaxial growth processes, such as metal-organic chemical vapor deposition (MOCVD) and molecular beam epitaxy (MBE).

Figure 2:
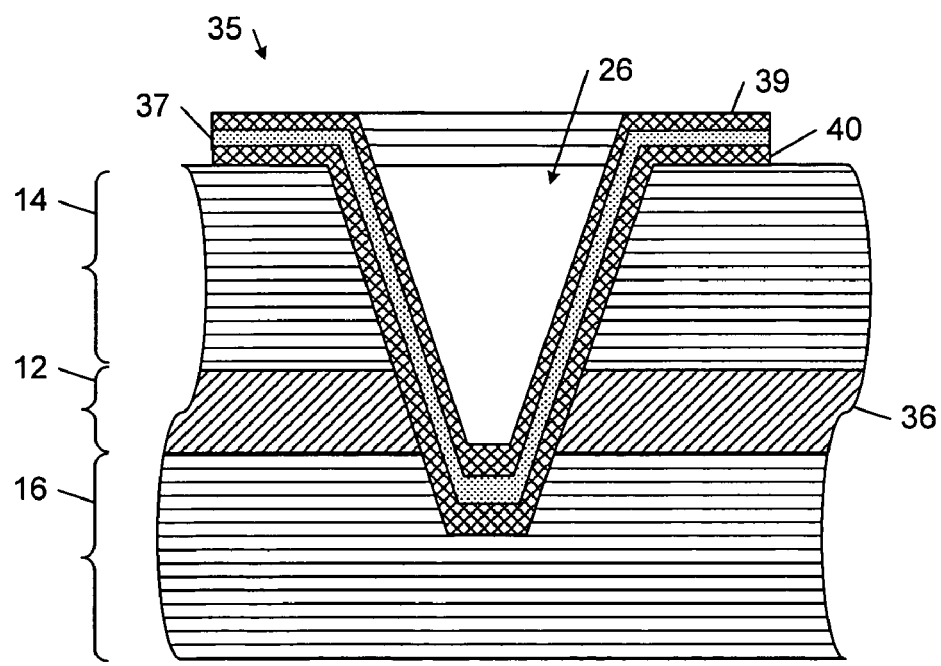
FIG. 2 is an enlarged diagrammatic cross-sectional side view of a region in the vicinity of an etched hole of the VCSEL of FIGS. 1A–1C.

As shown in FIGS. 1A, 1B and 2, in the illustrated embodiment, in a respective screening region at each etched hole 26 of VCSEL 10 is a defect indicator system 35 that includes an indicator layer 37, a barrier layer 39 overlying the indicator layer 37, and a barrier layer 40 underlying the indicator layer 37. As used herein, when referring to the location of the screening region in which the defect indicator is disposed relative to an etched hole 26, the preposition "at" refers to the presence of the screening region in, on or near the etched hole 26. In general, the defect indicator system 35 should be located close enough to at least one etched hole 26 to provide a statistically meaningful indication of the incidence of defects in one or more moisture passivating layers overlying the surfaces of the etched hole 26. In some embodiments, the defect indicator system 35 is separate and distinct from the moisture passivating layers. In these embodiments, the moisture passivation layers may be formed in accordance with one or more of the moisture passivation approaches described in U.S. patent application Ser. No. 10/341,089, filed Jan. 13, 2003, and U.S. patent application Ser. No. 10/013,108, filed Dec. 7, 2001. The defect indicator layers 35 in these embodiments may be positioned in the vicinity of (e.g., in, or, adjacent to, or near) the moisture passivation layers.

In the illustrated embodiment, in addition to providing an indication of moisture passivation defects, the defect indicator system 35 also passivates each of the etched holes 26 against moisture intrusion. In this way, the defect indicator system 35 addresses the unique susceptibility of VCSEL 10 to damage that otherwise might be caused by moisture intrusion into the etch holes 26. In particular, it has been observed that unpassivated and non-hermetically sealed planar index-guided VCSELs are subject to a high rate of catastrophic failure in humid environments. Under high-humidity conditions, the lifetime of such VCSEL devices may be limited to on the order of a few hundred hours, which is substantially less than the $10^5$ hour lifetimes that are observed for similar VCSEL devices under standard high-temperature, harsh aging conditions.

The defect indicator systems 35 cover defects and particles on the surfaces of the etched holes 26, thereby passivating the etched hole surfaces with a uniform and complete moisture penetration barrier. In the illustrated embodiment, defect indicator systems 35 correspond to a thin film stack that is patterned into a set of four rectangular patches. Each patch extends over the surfaces of a respective etched hole 26 to reduce moisture intrusion into the etched holes 26 and, thereby, substantially delay or effectively prevent moisture-related damage to VCSEL 10.

Indicator layer 37 is formed of any material composition that has a chemically alterable optical property. Exemplary optical properties include optical reflectivity, optical absorption, and optical transmission properties. In general, the optical property of the indicator layer 37 changes in response to exposure to a screening agent, which may be in gas (vapor), liquid, or plasma forms. The change in the optical property is detectable using automatic or manual optical equipment. For example, in some implementations, the optical reflectivity of the indicator layer 37 changes in response to exposure to an associated screening agent. The change in optical reflectivity may be detected, for example, as a change in the color of the indicator layer 37 or as a change in the intensity of a reflected optical probe signal. In some exemplary implementations, the optical reflectivity change induced by exposure to the screening agent is detectable by lo visual color inspection at one or more radiation wavelengths within the visible radiation wavelength range (i.e., within a range of about 390 nm to about 770 nm).

In some embodiments, the indicator layer 37 includes at least one component that is oxidizable by at least one oxidizing component of the screening agent. For example, in some implementations, the indicator layer 37 includes a metal (e.g., on or more of aluminum, titanium, and alloys thereof) that is oxidizable by an acidic component or a basic component of the screening agent.

In these implementations, the indicator layer metal exhibits a detectable change in color upon oxidation.

In some implementations, the indicator layer 37 includes a base layer that is impregnated with a dye. For example, an aluminum layer or a chromate conversion layer may be impregnated with a metallic azo dye, which has a color that is changed by bleaching or oxidation upon exposure to a screening agent. In some embodiments, the indicator layer 37 includes a polymer that has an alterable optical property. For example, in some implementations of this type, the polymer indicator layer 37 changes color or carries or a pigment that changes color upon exposure to the screening agent. The polymer may be formed of any polymer material that has an alterable optical property and is compatible with the process technology that is used to fabricate VCSEL 10.

The overlying and underlying barrier layers 39, 40 may be formed from any moisture-resistant materials that are compatible with the process technology that is used to fabricate VCSEL 10. In addition to providing moisture passivation of etch holes 26, barrier layer 40 promotes adhesion between the defect indicator system 35 and the top surface of the vertical stack structure of VCSEL 10. In some embodiments, barrier layer 40 is formed of an electrically insulating material (e.g., a nitride material, such as silicon nitride, silicon oxynitride, and titanium-tungsten nitride, or an oxide material, such as silicon oxide and titanium oxide). The overlying barrier layer 39 may be formed of the same or different electrically insulating material as the barrier layer 40. Alternatively, barrier layer 39 may be formed of a metal. In the case of incomplete or imperfect passivation of etch holes 26, barrier layer 39 is likely to exhibit holes, cracks, or other defects through which screening agent may penetrate and, thereby, react with the underlying indicator layer 37. In some embodiments, each of barrier layers 39, 40 is a low stress, high-density silicon nitride layer that is deposited using a conventional low-pressure chemical vapor deposition process and has a thickness in a range of about 100 nm to about 1000 nm. In some embodiments in which the indicator layer 37 is electrically insulating, the underlying barrier layer 40 may be omitted.

An exemplary VCSEL implementation includes a 540 nm silicon nitride underlying barrier layer 40, a 500 nm aluminum indicator layer 37, and a 760 nm overlying barrier layer 39. One exemplary screening agent for this implementation is a potassium hydroxide : water solution heated to a temperature in the range of about 60° C. to about 80° C.

Figure 3:
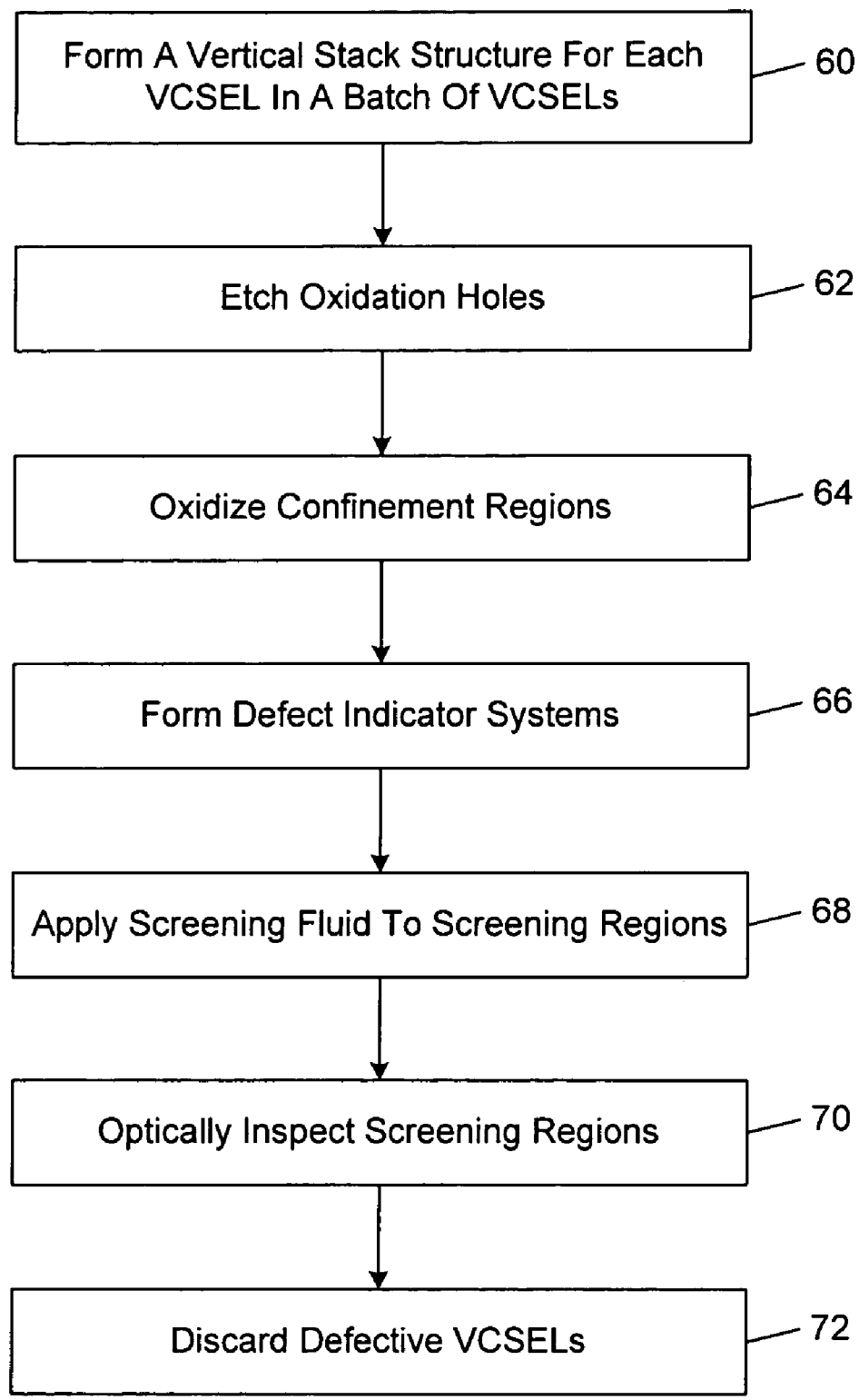
FIG. 3 is a flow diagram of a method of manufacturing the VCSEL embodiment of FIGS. 1A, 1B, and 1C.

FIG. 3 shows a flow diagram of an embodiment of a method of manufacturing VCSEL 10. A vertical stack structure is formed for each VCSEL in a batch of VCSELs (step 60). The vertical stack structure has a top surface and includes a top mirror, a bottom mirror, and a cavity region that is disposed between the top mirror and the bottom mirror and includes an active light generation region. Oxidation holes are etched into the vertical stack structure from the top surface to at least the oxidized peripheral region (step 62). At least one of the top mirror and the bottom mirror has a layer that is oxidized into an electrical insulator in a peripheral region to form a confinement region (step 64). A defect indicator system is formed in a screening region at one or more of the etched holes (step 66). Screening agent is applied to the screening region (step 68). The screening agent may be a gas, vapor, or liquid that chemically reacts with an indicator layer of the defect indicator system to induce a change in an alterable optical property of the indicator layer. In some implementations, the VCSEL is rinsed to remove any residual screening agent. The screening region is inspected optically (step 70). For example, in some implementations, the screening region is visually inspected under a microscope to detect the presence of any discolored areas of the screening region. VCSELs in which changes in the alterable optical property are observed or detected are labeled and subsequently discarded (step 72).

The above-described manufacturing process may include one or more additional fabrication process steps not specifically called out in the preceding paragraph, including industry-standard front-end, intermediate, and back-end VCSEL fabrication process steps.

Other embodiments are within the scope of the claims.

Figure 4:
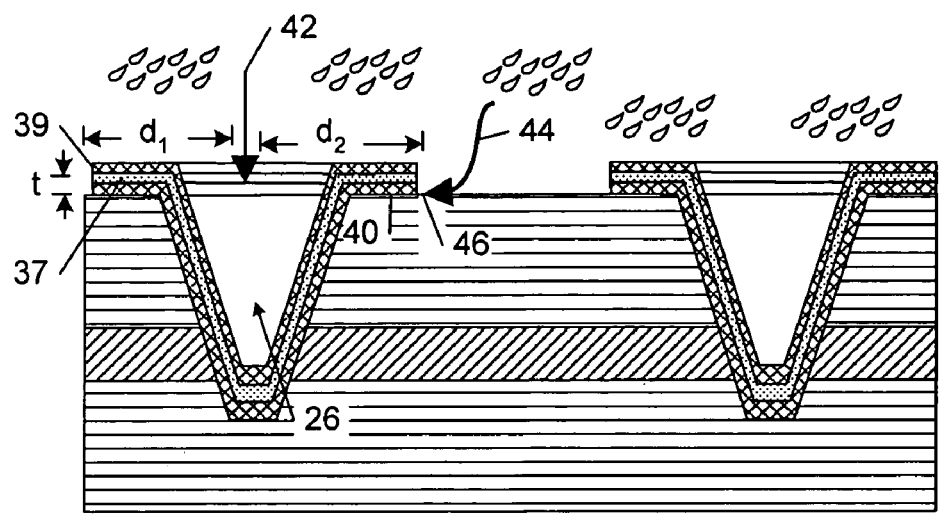
FIG. 4 is a diagrammatic cross-sectional side view of a VCSEL embodiment exposed to a moisture environment.

Referring to FIG. 4, in some embodiments, underlying barrier layer 40 has a thickness (t) that is sufficient to prevent substantial vertical moisture intrusion 42 into the etched holes 26. As explained in U.S. patent application Ser. No. 10/013,108, which was filed Dec. 7, 2002, the VCSEL failure rate in high humidity environments has been observed to decrease dramatically with passivation layer thickness after the passivation layer thickness reaches a first threshold. Beyond a second threshold, however, the decrease in failure rate is substantially less pronounced. In one embodiment, underlying barrier layer 40 is formed from silicon nitride that is deposited in accordance with a conventional low stress silicon nitride deposition process. In this embodiment, the first threshold thickness is approximately 300 nm and the second threshold thickness is approximately 500 nm. In other embodiments, the actual values for the threshold thicknesses will depend upon a number of factors, including the material properties of barrier layer 40.

In some embodiments, barrier layer 40 also extends laterally beyond the edges of the etched holes 26 by respective distances ($d_1$, $d_2$) that are sufficient to substantially prevent lateral moisture intrusion into the etched holes 26. Lateral moisture intrusion may result from leakage along a path extending to the etched holes from a moisture penetration interface 46, which is formed at the intersection of the top surface of first mirror stack 14 and the peripheral edges of barrier layer 40. In some embodiments having a silicon nitride moisture penetration barrier, the separation distances ($d_1$, $d_2$) between the peripheral edges of the barrier layer 40 and the peripheral edges of the etched holes at the top surface of first mirror stack 14 are on the order of at least 1 µm. In some embodiments, the separation distance between the peripheral edge of the barrier layer 40 and the peripheral edges of the etched holes may be constrained in one or more directions depending upon other device structures on the top surface of first mirror stack 14. For example, in some embodiments, the light emission region is substantially free of any overlying moisture penetration barrier material, in which case the separation distance cannot exceed the separation distance between the etched holes and the light emission region.

Figure 5:
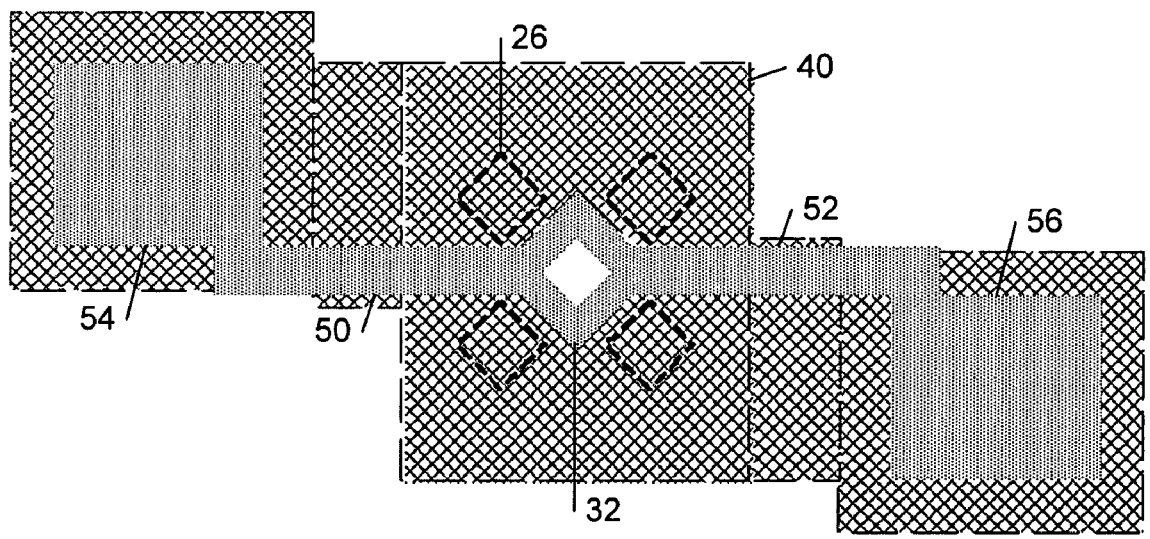
FIG. 5 is a diagrammatic top view of a planar VCSEL with four etched holes that are moisture passivated by an overlying moisture penetration barrier.

Referring to FIG. 5, in some embodiments, lateral moisture intrusion may result primarily from delamination of the barrier layer 40 from the top surface of first mirror stack 14. In some embodiments, total film strain of barrier layer 40—which correlates with the probability that the barrier layer 40 will delaminate from the top surface of first mirror stack 14—decreases exponentially with surface area. In these embodiments, to reduce lateral moisture intrusion into etched holes 26, barrier layer 40 is patterned into patches each having a lateral surface area that is sufficient to reduce the film stress per unit area to a level that avoids substantial delamination of the barrier layer 40. In the embodiment of FIG. 5, barrier layer 40 is formed as a single continuous film of material that overlies a substantial portion of the top surface of the first mirror stack, including each of the etched holes 26. In these embodiments, barrier layer 40 has an area that is sufficient to avoid substantial delamination of the barrier layer 40 and, thereby, substantially reduces lateral moisture intrusion into etched holes 26. In some embodiments, barrier layer 40 extends over as much of the top surface of the first mirror stack as is available. In the illustrated embodiment, metal lines 50, 52 may extend over barrier layer 40 from electrode 32 to bonding pads 54, 56, which also are disposed over barrier layer 40.

VCSEL devices having a silicon nitride barrier layer 40 with the surface layout shown in FIG. 5 and a thickness of 500 nm have been demonstrated to have lifetimes that are ten times longer than the lifetimes of non-passivated devices in humid environments.

Still other embodiments are within the scope of the claims. For example, although the above embodiments are described in connection with AlGaAs mirror stack systems, other semiconductor alloy compositions or dielectric layers may be used to form the DBR mirror structures.

What is claimed is:

1. A vertical cavity surface emitting laser (VCSEL), comprising:
    a vertical stack structure having a top surface and including
        a top mirror,
        a bottom mirror,
        a cavity region disposed between the top mirror and the bottom mirror and including an active light generation region,
        at least one of the top mirror and the bottom mirror having at least one layer defining a aperture region;
        wherein the vertical stack structure defines at least one sidewall area extending from the top surface to at least a depth corresponding to the aperture region; and
    a defect indicator system disposed in a screening region at the sidewall area, the defect indicator system including an indicator layer with a chemically alterable optical property, and a barrier layer overlying the indicator layer.

2. The VCSEL of claim 1, wherein the defect indicator system is disposed over surfaces of the vertical stack structure defining at least one etched hole.

3. The VCSEL of claim 1, wherein the indicator layer has a chemically alterable optical reflectivity.

4. The VCSEL of claim 3, wherein the chemically altered optical reflectivity of the indicator layer is detectable at a radiation wavelength within a range of about 390 nm to about 770 nm.

5. The VCSEL of claim 1, wherein the indicator layer includes a metal.

6. The VCSEL of claim 5, wherein the indicator layer includes at least one of the following: aluminum; an aluminum alloy; titanium; and a titanium alloy.

7. The VCSEL of claim 1, wherein the indicator layer includes a base layer impregnated with a dye.

8. The VCSEL of claim 1, wherein the indicator layer includes a polymer.

9. The VCSEL of claim 1, wherein the overlying barrier layer is formed of an electrically insulating material.

10. The VCSEL of claim 9, wherein the overlying barrier layer is formed of an electrically insulating semiconductor material.

11. The VCSEL of claim 10, wherein the overlying barrier layer is formed of at least one of a semiconductor oxide material and a semiconductor nitride material.

12. The VCSEL of claim 1, wherein the defect indicator system further includes a barrier layer underlying the indicator layer.

13. The VCSEL of claim 12, wherein the underlying barrier layer is formed of an electrically insulating material.

14. The VCSEL of claim 13, wherein the underlying barrier layer includes a nitride.

15. The VCSEL of claim 1, wherein:
    the defect indicator system includes a peripheral edge intersecting the top surface of the vertical stack structure at a moisture penetration interface; and
    at the top surface of the vertical stack structure the sidewall area is circumscribed by a respective peripheral edge having a substantial portion separated from the moisture penetration interface by a distance of approximately 1 µm or greater.

16. A method of manufacturing a vertical cavity surface emitting laser (VCSEL), comprising forming:
    a vertical stack structure having a top surface and including
        a top mirror,
        a bottom mirror,
        a cavity region disposed between the top mirror and the bottom mirror and including an active light generation region,
        at least one of the top mirror and the bottom mirror having at least one layer defining an aperture region;
        wherein the vertical stack structure defines at least one sidewall area extending from the top surface to at least a depth corresponding to the aperture region; and
    a defect indicator system disposed in a screening region at the sidewall area, the defect indicator system including an indicator layer with a chemically alterable optical property, and a barrier layer overlying the indicator layer.

17. The method of claim 16, further comprising exposing at least the screening region to a screening agent having at least one component chemically reactive with the indicator layer to alter the optical property of the exposed indicator layer.

18. The method of claim 17, further comprising optically inspecting the exposed screening region for defects based on alteration of the optical property of the exposed indicator layer.

19. The method of claim 17, wherein the indicator layer includes at least one component oxidizable by at least one oxidizing component of the screening agent.

20. The method of claim 17, wherein the overlying barrier layer is formed of a material defect-free regions of which are substantially impermeable to the screening agent.

* * * * *